United States Patent
Kijima et al.

[11] Patent Number: 6,165,622
[45] Date of Patent: *Dec. 26, 2000

[54] FERROELECTRIC THIN FILM, SUBSTRATE PROVIDED WITH FERROELECTRIC THIN FILM, DEVICE HAVING CAPACITOR STRUCTURE AND METHOD FOR MANUFACTURING FERROELECTRIC THIN FILM

[75] Inventors: Takeshi Kijima, Omiya; Hironori Matsunaga, Noda, both of Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/773,176

[22] Filed: Dec. 27, 1996

[30] Foreign Application Priority Data

Dec. 27, 1995 [JP] Japan .................................. 7-353049

[51] Int. Cl.[7] ........................................ B32B 17/00
[52] U.S. Cl. ................. 428/469; 428/472; 428/701; 428/702; 427/585; 427/126.3; 252/519.12; 252/519.13
[58] Field of Search ..................... 428/701, 702, 428/469, 472; 252/295, 519.12, 519.13; 427/141, 126.3, 585

[56] References Cited

U.S. PATENT DOCUMENTS

| | | | |
|---|---|---|---|
| 5,423,285 | 6/1995 | Paz de Araujo | 117/90 |
| 5,576,564 | 11/1996 | Satoh | 257/295 |
| 5,811,181 | 9/1998 | Kijima | 428/328 |

OTHER PUBLICATIONS

Nakamura et al. (1993) *Jpn.J. Appl. Phys.*, vol.32 (No. 9B)pp. 4086–4088.

*Primary Examiner*—Timothy M. Speer
*Attorney, Agent, or Firm*—Birch, Stewart, Kolasch & Birch, LLP

[57] ABSTRACT

A ferroelectric thin film includes a ferroelectric crystal containing Bi, Ti and O as constituent elements, wherein the composition ratio of Bi/Ti in the ferroelectric thin film is shifted from a stoichiometric composition. Also, a substrate provided with a ferroelectric thin film, a device having a capacitor structure used for a ferroelectric memory device, a pyroelectric sensor device, a piezoelectric device or the like, and a method for manufacturing a ferroelectric thin film are disclosed.

17 Claims, 13 Drawing Sheets

FERROELECTRIC THIN FILM, SUBSTRATE PROVIDED WITH FERROELECTRIC THIN FILM, DEVICE HAVING CAPACITOR STRUCTURE AND METHOD FOR MANUFACTURING FERROELECTRIC THIN FILM

BACKGROUND OF THE INVENTION

1. Field of the Invention

The present invention relates to a ferroelectric thin film, a substrate provided with a ferroelectric thin film, a device having a capacitor structure and a method for manufacturing a ferroelectric thin film. More particularly, the present invention relates to a ferroelectric thin film, a substrate provided with a ferroelectric thin film and a device having a capacitor structure used for a ferroelectric memory device, a pyroelectric sensor device, a piezoelectric device or the like, and a method for manufacturing a ferroelectric thin film.

2. Description of the Related Arts

Ferroelectrics have been widely used for the development of devices such as a condenser, an oscillator, an optical modulator and an infrared light sensor since ferroelectrics have numerous functions such as spontaneous polarization, high dielectric constant, electro-optical effect, piezoelectric effect and pyroelectric effect.

In accordance with the development of technique for forming a thin film, the application field of the ferroelectric thin film is becoming wider. For example, reduction of capacitor area for high integration of devices and improvement of reliability has been being developed by applying the high ferroelectric characteristics to various kinds of semiconductor devices such as a DRAM. Also, development of ferroelectric non-volatile memories (FRAM) having high density and high operation speed has been recently taking place by combination with semiconductor memory devices such as a DRAM. Ferroelectric non-volatile memories eliminate the need for back-up power supply by utilizing the ferroelectric properties (hysteresis effect) of the ferroelectrics. For the development of such devices, it is necessary to use a material having characteristics such as large remanent spontaneous polarization (Pr), small coercive field (Ec), small leakage currents and large resistance to repetition of polarization inversion. Further, it is desired to realize the above properties with a thin film having a thickness of 200 nm or below so as to reduce the operation voltage and to conform to fine processing of semiconductors.

For the purpose of applying thin films to FRAM or the like, forming of thin films with ferroelectric lead (Pb) oxide compounds such as $PbTiO_3$, $Pb(Zr_{1-x}Ti_x)O_3$ (PZT), PLZT is now being tried by employing methods for forming a thin film such as sputtering, vapor deposition, sol-gel method and MOCVD method.

Among the above-described ferroelectric materials, $Pb(Zr_{1-x}T_x)O_3$ (PZT) is the one that has been intensively studied recently, and a thin film having a good ferroelectric property has been obtained by sputtering method or sol-gel method. For example, a thin film having a remanent spontaneous polarization Pr as large as $10 \mu C/cm^2$ to $26 \mu C/cm^2$ has been obtained. However, there is a problem that leakage currents occur and resistance to polarization inversion decrease as the thickness of the film is reduced (thinning of the film). This is due to the fact that the ferroelectric property of PZT, which depends largely on the composition x, is liable to change because PZT contains Pb having a high vapor pressure and, therefore, the film composition is liable to change at the time of forming or heat-treatment of the film, and also due to generation of pinholes and generation of layers having a low dielectric constant owing to the reaction of the underlying layer and Pb. Accordingly, the development of other materials excellent in ferroelectric property and resistance to polarization inversion is desired. Also, in view of the application to integrated devices, high density of the thin film is required for fine processing of the devices.

As other oxide ferroelectrics, there is known a group of bismuth oxide ferroelectrics having a layered crystal structure such as shown by the following general formula.

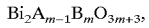

wherein A is selected from $Na^{1+}$, $K^{1+}$, $Pb^{2+}$, $Ca^{2+}$, $Sr^{2+}$, $Ba^{2+}$ and $Bi^{3+}$; and B is selected from $Fe^{3+}$, $Ti^{4+}$, $Nb^{5+}$, $Ta^{5+}$, $W^{6+}$ and $Mo^{6+}$; and m is a positive integer. The basic crystal structure of the ferroelectrics represented by the above general formula is such that a layered perovskite layer consisting of a series of perovskite lattices made of (m-1) $ABO_3$ is interposed between $(Bi_2O_2)^{2+}$ layers. Numerous materials in which A is selected from Sr, Ba and Bi, and B is selected from Ti, Ta and Nb show ferroelectric properties.

Among the ferroelectrics represented by the above general formula, $Bi_4Ti_3O_{12}$ (bismuth titanate) is a ferroelectric having a layered perovskite structure (rhombic crystal/ lattice constants: a=5.411 Å, c=32.83 Å) with strong anisotropy. The ferroelectric property of its single crystal is such that, along the a-axis, the remanent spontaneous polarization is $Pr=50 \mu C/cm^2$ and the coercive field is Ec=50 kV/cm; and, along the c-axis, the remanent spontaneous polarization is $Pr=4 \mu C/cm^2$ and the coercive field is Ec=4 kV/cm. As shown above, $Bi_4Ti_3O_{12}$ has the strongest a-axis component of spontaneous polarization and has a very small c-axis component of the coercive field when compared with the above other bismuth oxide ferroelectrics.

It will be possible to apply this ferroelectric to electronic devices such as ferroelectric non-volatile memories if the orientation of thin films can be controlled for utilizing the properties of large spontaneous polarization and small coercive field which $Bi_4Ti_3O12$ has. However, the cases that have been reported so far utilize only the c-axis orientation along which the spontaneous polarization is small or the random orientation, so that the large spontaneous polarization along the a-axis has not been utilized to the full extent yet.

On the other hand, formation of a thin film with $Bi_4Ti_3O12$ has so far been tried by MOCVD method or sol-gel method. Among these, the conventional sol-gel method of forming a ferroelectric thin film need thermal treatment processing of 650° C. or more for obtaining a good ferroelectric property and, further, it has been difficult to apply the thin film to highly integrated devices which need fine processing because the film surface morphology consists of crystal particles of about 0.5 μm. Moreover, since the $Bi_4Ti_3O_{12}$ thin film of the c-axis orientation is formed on a Pt electrode layer/$SiO_2$ insulation film/Si substrate or on a Pt substrate with the substrate temperature being 600° C. or more, the formation of ferroelectric thin films by MOCVD method cannot be directly applied to actual device structures. Namely, as in the case of Pt/$SiO_2$/Si substrate, a bonding layer such as a Ti film must be formed between the Pt electrode layer and the underlying $SiO_2$ film in order to ensure the bonding strength between the Pt electrode layer and the $SiO_2$ film. However, it has been reported that, if a $Bi_4Ti_3O12$ thin film is formed by MOCVD method on the Pt electrode substrate having the bonding layer, the film surface morphology consists of gross crystal particles and pyrochlore phase ($Bi_2Ti_2O_7$) is prone to be generated (See Jpn, J. Appl. Phys., 32, 1993, pp. 4086, and J. Ceramic Soc. Japan, 102, 1994, pp. 512). If the film surface morphology consists of gross crystal particles, the thin film cannot be applied to highly integrated devices which needs fine processing and, moreover, pinholes are generated by thin films, causing leakage currents. Accordingly, it is difficult to form a ferroelectric thin film having a good ferroelectric property with a thickness of 200 nm or less by such a conventional technique.

As described above, the conventional technique involves problems that the large spontaneous polarization of $Bi_4Ti_3O_{12}$ along the a-axis has not been utilized to the full extent and that the density and the flatness of the film surface that are needed for fine processing and reducing leakage currents in view of applying the ferroelectric thin film to highly integrated devices have not been obtained.

SUMMARY OF THE INVENTION

The present invention provides a ferroelectric thin film comprising a ferroelectric crystal containing Bi, Ti and O as constituent elements, wherein the composition ratio of Bi/Ti in the ferroelectric thin film is shifted from a stoichiometric composition.

The present invention also provides a substrate provided with a ferroelectric thin film; comprising a semiconductor substrate; a buffer layer formed on the semiconductor substrate and comprising titanium oxide; and a ferroelectric thin film of the above.

Further, the present invention provides a device having a capacitor structure, comprising at least one pair of electrodes and a ferroelectric thin film of the above being interposed between the pair of electrodes.

The present invention also provides a device having a capacitor structure, comprising the substrate provided with a ferroelectric thin film of the above, wherein the capacitor structure is such that a lower electrode is disposed between the substrate and the buffer layer and an upper layer is disposed on the ferroelectric thin film.

Also, the present invention provides a method for manufacturing a ferroelectric thin film comprising a ferroelectric crystal containing Bi, Ti and O as constituent elements, wherein an orientation of the ferroelectric crystal in the ferroelectric thin film is controlled by varying the composition ratio of Bi/Ti in the ferroelectric thin film so that the composition ratio is shifted from a stoichiometric composition.

DETAILED DESCRIPTION OF THE PREFERRED EMBODIMENTS

Figure 1:
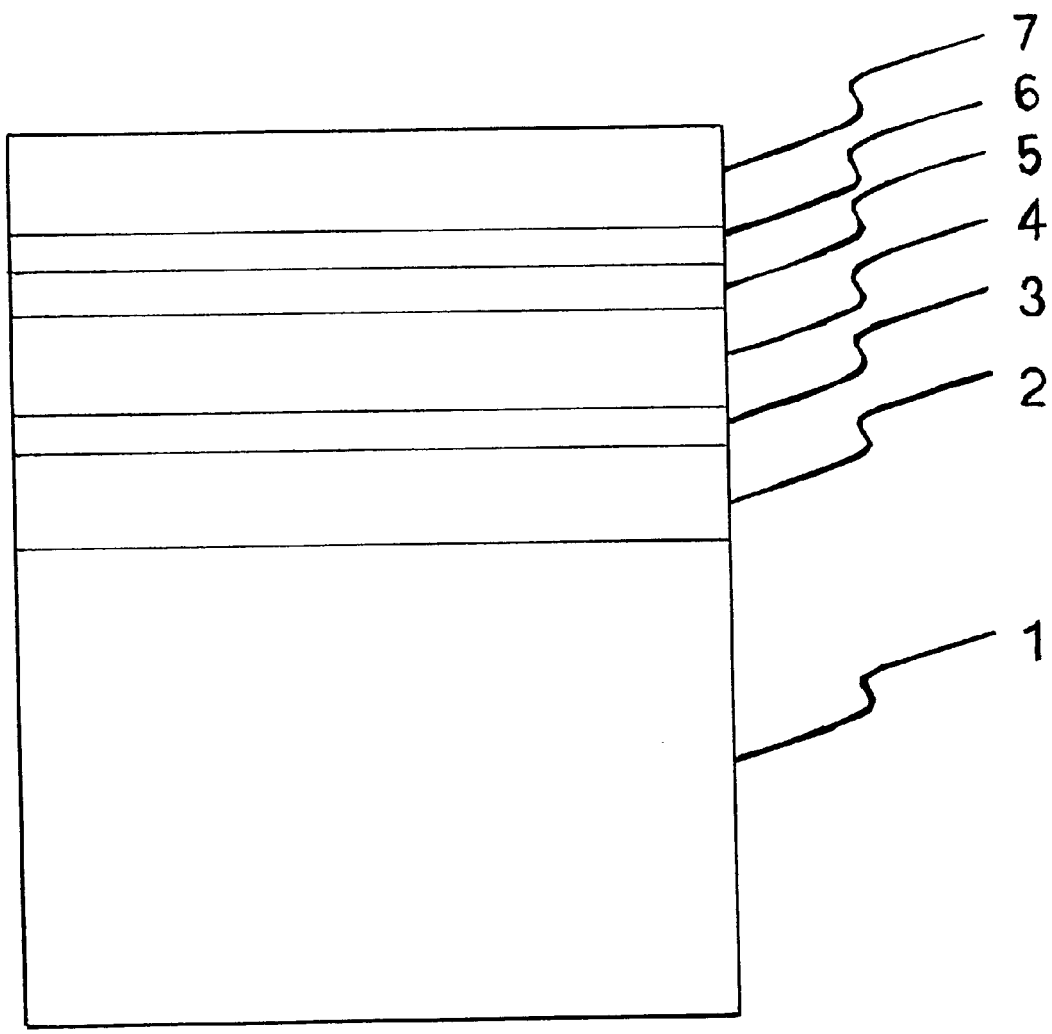
FIG. 1 is a schematic cross-sectional view showing a structure of the substrate provided with a ferroelectric thin film according to the first embodiment of the present invention.

In the present invention, a ferroelectric thin film is generally formed on a semiconductor substrate. As the semiconductor substrate, a single crystal silicon substrate, a polycrystalline silicon substrate, a GaAs substrate or the like may be used as well.

The ferroelectric thin film of the invention contains Bi, Ti and O as constituent elements, the composition ratio of Bi/Ti in the ferroelectric thin film being shifted from a stoichiometric composition ($Bi_4Ti_3O_{12}$:4/3). As the ferroelectric thin film, the present invention is not specifically limited thereto, and it is to be understood that a ferroelectric thin film comprising a ferroelectric bismuth oxide crystal having a layered perovskite structure and including Bi, Ti and O as constituent elements in a similar manner, the composition ratio of Bi/Ti in the ferroelectric thin film being shifted from a stoichiometric composition may be also effective. Such ferroelectric bismuth oxide crystal may be $Bi_2A_{m-1}B_mO_{3m+3}$ (A, B, m are the same meaning as the above). For example, $SrBi_4Ti_4O_{15}$, $BaBi_4Ti_4O_{15}$, $PbBi_4Ti_4O_{15}$, $Na_{0.5}Bi_{4.5}Ti_4O_{15}$, $K_{0.5}Bi_{4.5}Ti_4O_{15}$, $Sr_2Bi_4Ti_5O_{18}$, $Ba_2Bi_4Ti_5O_{18}$, and $PbBi_4Ti_5O_{18}$.

The ferroelectric thin film of the invention may be formed by the MOCVD method. The ferroelectric thin film is formed by supplying triorthotolylbilyl bismuth ($Bi(o-OC_7H_7)_3$), $BiH_3$, $BiCl_3$, $BiBr_3$, $BiI_3$, $Bi(CH_3)_3$, $Bi(C_2H_5)_3$, $Bi(n-C_3H_7)_3$, $Bi(n-C_4H_9)_3$, $Bi(i-C_4H_9)_3$, $Bi(n-C_5H_{11})_3$, $Bi(C_6H_5)_3$, $Bi(2-CH_3C_6H_4)_3$, $Bi(4-CH_3C_6H_4)_3$, $Bi(OCH_2CH_2N(CH_3)_2)_3$, $Bi(OCHCH_3CH_2N(CH_3)_2)_3$, $Bi(OC(CH_3)_2CH_2CH_3)_3$, among them $Bi(o-OC_7H_7)_3$ is preferable, as a Bi source material and titanium isopropoxide ($Ti(i-OC_3H_7)_4$), $TiCl_4$, $Ti(C_5H_5)Cl_2$, $Ti(OCH_3)_4$, $Ti(OC_2H_5)_4$, $Ti(O-n-C_3H_7)_4$, $Ti(O-n-C_4H_9)_4$, $Ti(O-t-C_4H_9)_4$, $Ti(O-n-C_5H_{11})_4$, $TiOCH((CH_3)_2CCO)_2$, $TiCl_2CH((CH_3)_2CCO)_2$, among them $Ti(i-OCH_3H_7)_4$ is preferable, as a Ti source material, the source materials being gasified by heating.

Those source materials is gasified by heating in the range of 100 to 200° C. or 30 to 80° C., respectively and supplied with an inactive gas such as argon (Ar) constituting a carrier gas and with a gas containing $O_2$ such as oxygen ($O_2$) gas constituting a reaction gas into the film forming chamber. The flow rate at the time of supplying the Bi source gas is varied within the range from 100 to 500 sccm, and the Ti source gas is varied within the range from 10 to 100 sccm. The flow rate at the time of supplying the gas containing $O_2$ gas is varied within the range from 700 to 1200 sccm. The degree of vacuum in the film forming chamber is preferably set to be 10 Torr or below. The temperature (substrate temperature) at the time of forming the ferroelectric thin film by MOCVD is preferably set to be 400° C., but the temperature is not specifically limited thereto. However, in view of applying the ferroelectric thin film to highly integrated devices, the temperature is preferably less than 600° C. Further, for maintaining good crystallinity of the thin film, the temperature is preferably more than 350° C. If the ferroelectric thin film is formed by supplying the source gas at a constant rate, the ferroelectric thin film will have the same composition and the same property with respect to the thickness direction. However, if the ferroelectric thin film is formed by supplying the source gas at continuously or stepwise varying rate, the ferroelectric thin film will have varying composition with respect to the thickness direction. The thickness of the ferroelectric thin film is not specifically limited, but is preferably within the range of, for example, about 50 to 200 nm.

Here, bismuth oxide was generated in the ferroelectric thin film if the Bi source gas was supplied at a further excess flow rate at the time of forming the crystal nucleus layer and the ferroelectric thin film so as to obtain a ferroelectric thin film having the Bi/Ti composition ratio larger than 1.5. Namely, bismuth oxide was confirmed to be generated in the ferroelectric thin film having the Bi/Ti composition ratio larger than 1.5. This shows that the substrate provided with the ferroelectric thin film comprising bismuth titanate thin film should preferably have a Bi/Ti composition ratio of less than 1.5. Here, the Bi/Ti composition ratio should preferably be more than 0.7.

In the substrate provided with the ferroelectric thin film on the invention, a buffer layer is disposed between the semiconductor substrate and the ferroelectric thin film. The buffer layer is not specifically limited and may preferably be formed of, for example, titanium oxide. The titanium oxide buffer layer may be formed by the MOCVD method with the same material as the above Ti source material and $O_2$ gas. The flow rate at the time of supplying the Ti source gas is varied within the range from 10 to 100 sccm. The flow rate at the time of supplying the $O_2$ gas is varied within the range from 700 to 1200 sccm. The degree of vacuum in the film forming chamber is preferably set to be 10 Torr or below. The temperature (substrate temperature) at the time of forming the buffer layer is preferably set to be in the range of 350 to 600° C. The thickness of the buffer layer may be within the range from 1 nm to 10 nm for performing its function.

The buffer layer may be formed directly on the semiconductor substrate. However, an insulating layer, a bonding layer and an electrode layer may, for example, be optionally formed between the semiconductor substrate and the buffer layer. The materials to be used and the thickness of the layers to be formed are not specifically limited. As the insulating layer, it is possible to use a $SiO_2$ film, a silicon nitride film or the like formed by sputtering method, vacuum vapor deposition, MOCVD method or the like. The material and the thickness may be arbitrarily chosen as long as the film can provide sufficient insulation. The bonding layer serves to prevent exfoliation (peeling off) of the film due to the difference in thermal expansivity between the substrate and the electrode layer in forming the film. Accordingly, the thickness of the bonding layer may be such that the bonding layer can prevent the exfoliation of the film. The material for the bonding layer may be titanium (Ti) or the like instead of Ta. However, when a Pt layer is used as the electrode layer, it is preferable to use Ta in view of its bonding property with the electrode layer to be formed thereon and the thermal expansion coefficient. The electrode layer is not limited and may be an ordinary electrically conductive material used for an electrode and can be suitably selected in relation to the other films. The thickness of the electrode layer may be such that the lower electrode can function as an electrode. The electrode layer may be formed by sputtering method, vacuum vapor deposition, MOCVD method or the like.

The crystal nucleus layer may be disposed between the above buffer layer and the ferroelectric thin film. Since the crystal nucleus layer serves, as a growth nucleus in the ferroelectric thin film, to allow its crystallinity to be succeeded, the material for the crystal nucleus layer preferably should have a crystal structure (layered perovskite structure) similar to, more preferably identical to, the one in the ferroelectric thin film to be formed thereon. It was confirmed that the thickness of the crystal nucleus layer may be within the range from 5 nm to 10 nm for performing its function. If the crystal nucleus layer is to be formed by MOCVD method, the temperature for forming the layer should preferably be within the range from 450° C. to 650° C. This is due to the fact that the temperature of more than 450° C. is preferable in order for the crystal nucleus layer to be a growth nucleus for forming the ferroelectric thin film and that the temperature of less than 650° C. would cause no particular problems in applying the ferroelectric thin film to highly integrated devices because the crystal nucleus layer can be formed in a very short time compared with the ferroelectric thin film itself.

The above substrate provided with the ferroelectric thin film, having the insulating layer, bonding layer, electrode layer and buffer layer, is used as a device having a capacitor structure, and also as a device having a capacitor structure which has further an upper electrode. In this case, the thickness of the upper electrode may be such that the upper electrode 8 can perform a sufficient function as an electrode.

The material for the upper electrode 8 is not specifically limited to Pt alone, but may be any electrically conductive material used for an ordinary electrode, and can be suitably selected with regard to the other films. The method for forming the film is not limited to sputtering method alone, and an ordinary technique such as vacuum vapor deposition for forming a film may be used.

In the above, devices having a capacitor structure are prepared by using Pt/Ta/SiO$_2$/Si substrate as the substrate. However, the present invention is not specifically limited thereto. For example, it is possible to construct a structure comprising an integrated circuit on a Si or GaAs substrate, an interlayer insulating film such as silicon oxide or silicon nitride formed on a surface of the integrated circuit, an electrode layer formed on the interlayer insulating film and electrically connected to devices in the integrated circuit via a contact hole formed on a portion of the interlayer insulating film, and a ferroelectric thin film of the present invention formed on the electrode layer. Thus, the present invention can be applied to integrated circuit devices electrically connected to devices in an integrated circuit and having a capacitor structure according to the above embodiments or having a transistor structure, and to other various highly integrated devices such as ferroelectric memory devices, pyroelectric sensor devices, and piezoelectric devices.

The present invention will be detailed by way of embodiments in conjunction with the attached drawings, which are not to be construed as being intended to limit the scope of the present invention.

EXAMPLE 1

FIG. 1 is a schematic cross-sectional view showing a structure of a substrate provided with a ferroelectric thin film according to the first embodiment of the present invention. Referring to FIG. 1, this device having a capacitor structure comprises a silicon oxide (SiO$_2$) layer 2, a bonding layer 3, a lower electrode 4, a titanium oxide buffer layer 5, a crystal nucleus layer 6 and a ferroelectric thin film 7 sequentially formed on a silicon (Si) substrate 1, the ferroelectric thin film 7 comprising a ferroelectric crystal containing Bi, Ti and O as constituent elements, wherein the composition ratio of Bi/Ti in the ferroelectric thin film is shifted from a stoichiometric composition.

In the first embodiment, a single crystal silicon wafer was used for the silicon substrate 1, and a silicon oxide thin film obtained by thermal oxidation of a surface of the single crystal silicon wafer was used for the SiO$_2$ layer 2. A tantalum (Ta) thin film was used for the bonding layer 3; a platinum (Pt) thin film for the lower electrode 4; a bismuth titanate thin film (Bi$_4$Ti$_3$O$_{12}$ thin film) for the crystal nucleus layer 6; and a bismuth titanate thin film (Bi$_4$Ti$_3$O$_{12}$ thin film) for the ferroelectric thin film 7.

A method for manufacturing the substrate provided with the ferroelectric thin film shown in FIG. 1 according to the first embodiment of the present invention will be hereinafter explained.

First, manufacturing of the Pt/Ta/SiO$_2$/Si substrate will be explained. A SiO$_2$ layer 2 is formed to a thickness of 200 nm by thermal oxidation of a surface (100) of the single crystal silicon wafer which is the silicon substrate 1. A Ta thin film constituting the bonding layer 3 was formed to a thickness of 30 nm by sputtering method, and a Pt (111) thin film constituting the lower electrode 4 was formed to a thickness of 200 nm by sputtering method.

Subsequently, a titanium oxide buffer layer 5 was formed on the Pt/Ta/SiO$_2$/Si substrate manufactured as shown above to a thickness of 50 nm by setting the substrate temperature to be 400° C., supplying titanium isopropoxide (Ti(i—OC$_3$H$_7$)$_4$) gasified by heating to 50° C. and carried in an Ar carrier gas (flow rate: 50 sccm) as a Ti source material. If the degree of vacuum in the film forming chamber is more than 10 Torr, gas phase reaction is liable to take place, so that the degree of vacuum was set to be 5 Torr in this film forming process.

After the titanium oxide buffer layer 5 was formed, a 5 nm thickness of a Bi$_4$Ti$_3$O$_{12}$ crystal nucleus layer 6 and a ferroelectric Bi$_4$Ti$_3$O$_{12}$ thin film 7 were sequentially formed on the titanium oxide buffer layer 5 under the condition shown in Table 1, thereby obtaining the substrate provided with the ferroelectric thin film with the total thickness of the titanium oxide buffer layer 6, the crystal nucleus layer 6 and the ferroelectric thin film 7 being 100 nm, as shown in FIG. 1.

TABLE 1

| source | Bi(o-C$_7$H$_7$)$_3$ | Ti(i-OC$_3$H$_7$)$_4$ |
|---|---|---|
| source temperature | 160° C. | 50° C. |
| carrier gas (Ar) flow rate | 150–300 sccm | 50 sccm |
| reaction gas (O$_2$) flow rate | 1000 sccm | |
| gas pressure in film forming chamber | 5 Torr | |
| substrate | Pt/Ta/SiO$_2$/Si (100) | |
| substrate temperature (film forming temperature) | crystal nucleus layer: 600° C. ferroelectric thin film: 400° C. | |

The Bi$_4$Ti$_3$O$_{12}$ crystal nucleus layer 6 and the ferroelectric Bi$_4$Ti$_3$O$_{12}$ thin film 7 were formed by supplying triortho-tolylbilyl bismuth (Bi(o—OC$_7$H$_7$)$_3$) as a Bi source material and titanium isopropoxide (Ti(i—OC$_3$H$_7$)$_4$) as a titanium source material, the source materials being gasified by heating to the source temperatures shown in Table 1 (Bi source temperature: 160° C., Ti source temperature: 50° C.) and supplied with an argon (Ar) gas constituting a carrier gas and with an oxygen (O$_2$) gas constituting a reaction gas into the film forming chamber. The flow rate at the time of supplying the Ar gas was varied within the range from 150 to 300 sccm relative to the Bi source material and was maintained at 50 sccm (constant) relative to the Ti source material. The flow rate at the time of supplying the O$_2$ gas was maintained at 1000 sccm (constant). The degree of vacuum in the film forming chamber was also set to be 5 Torr in these film forming processes as in forming the titanium oxide buffer layer 5.

In manufacturing the above substrate provided with the ferroelectric thin film 7, the supply amount of the Bi source material gas was controlled by varying the flow rate of the Ar carrier gas of the Bi source material gas to be within the range from 150 to 300 sccm at the time of forming the Bi$_4$Ti$_3$O$_{12}$ crystal nucleus layer 6 and the ferroelectric Bi$_4$Ti$_3$O$_{12}$ thin film 7. Nine substrates coated with ferroelectric thin film 7 were prepared by setting the flow rate of the Bi source material gas (the flow rate of Ar carrier gas relative to Bi source material gas) to be 150, 170, 180, 190, 200, 220, 230, 250 and 300 sccm. The Bi/Ti composition ratio of each of the obtained ferroelectric Bi$_4$Ti$_3$O$_{12}$ thin films 7 was analyzed by using EPMA. The result is shown in Table 2.

TABLE 2

| Bi source gas flow rate (sccm) | 150 | 170 | 180 | 190 | 200 | 220 | 230 | 250 | 300 |
|---|---|---|---|---|---|---|---|---|---|
| Bi/Ti composition ratio | 0.5 | 0.7 | 0.8 | 0.9 | 1.0 | 1.22 | 4/3 | 1.42 | 1.47 |

Figure 2:
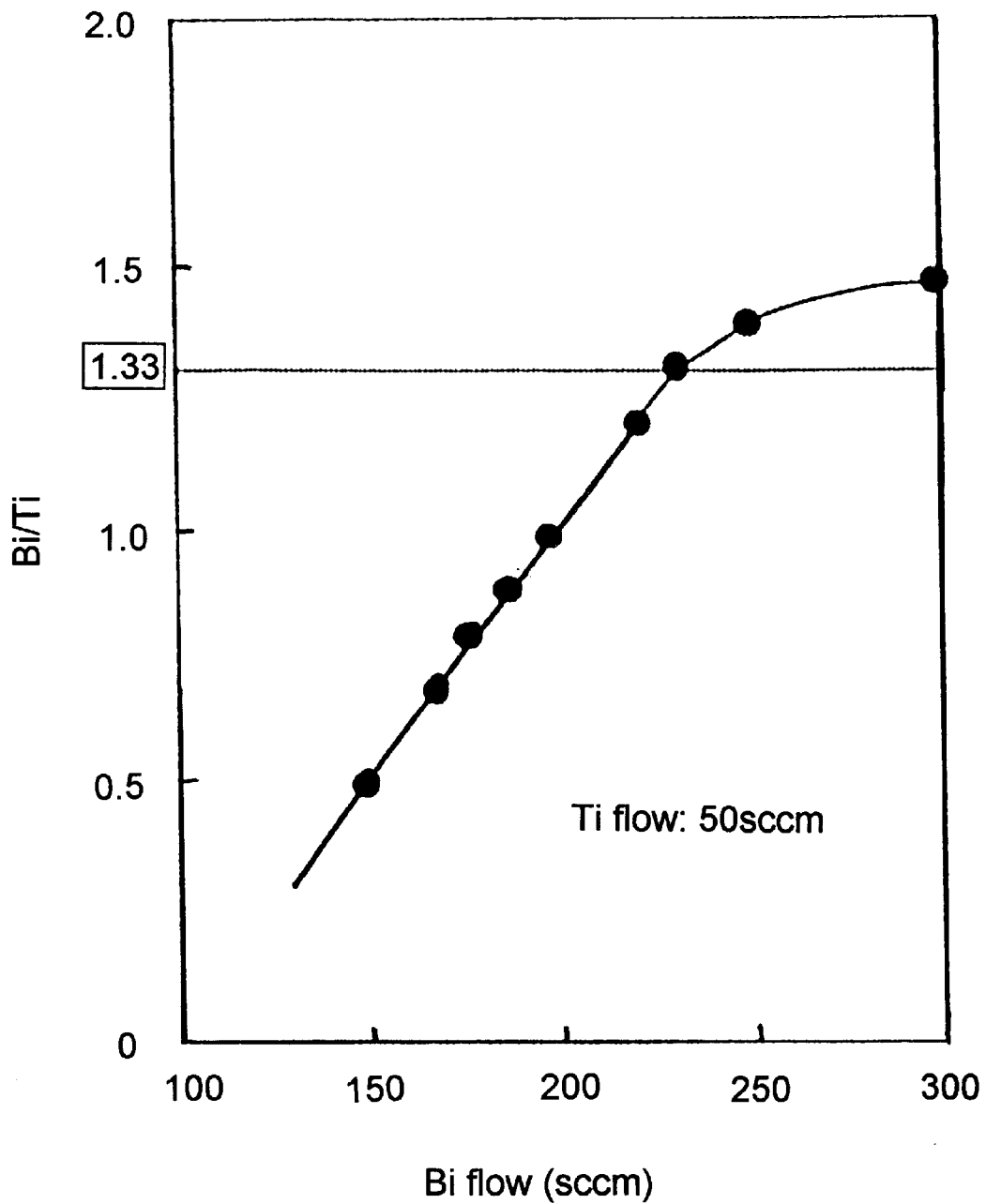
FIG. 2 is a view showing a relationship between the amount of Bi source gas flow rate (Bi flow rate) and the composition ratio of Bi/Ti in the ferroelectric thin film in forming the ferroelectric $Bi_4Ti_3O_{12}$ thin film on the substrate according to the first embodiment of the present invention.

FIG. 2 was obtained by plotting the flow rate of Bi source material gas (Bi flow rate) on the axis of abscissa and plotting the Bi/Ti composition ratio on the axis of ordinate so as to show their relationship in accordance with the result of Table 2. FIG. 2 shows that the Bi/Ti composition ratio increases approximately in proportion to the increase of the flow rate of Bi source material gas if the Bi/Ti composition ratio is smaller than the stoichiometric ratio of $Bi_4Ti_3O_{12}$ (Bi/Ti=4/3), but the increase in the Bi/Ti composition ratio tends to become saturated if the flow rate of Bi source material gas further increases and the Bi/Ti composition ratio is larger than the vicinity of the stoichiometric ratio of $Bi_4Ti_3O_{12}$ (Bi/Ti=4/3).

Figure 3:
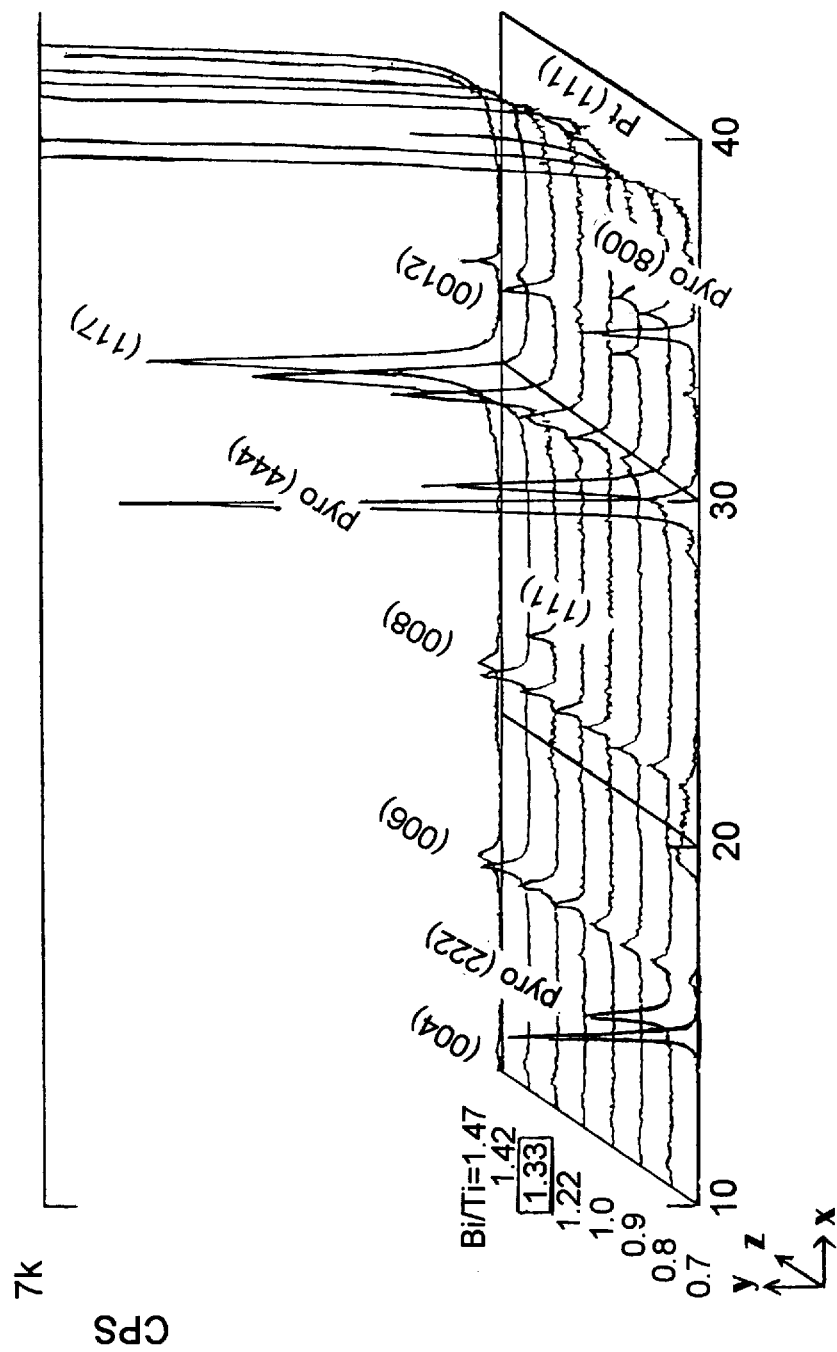
FIG. 3 is a view showing a result of observation by X-ray diffraction of the ferroelectric $Bi_4Ti_3O_{12}$ thin film according to the first embodiment of the present invention.

FIG. 3 shows X-ray diffraction patterns of the above nine substrates coated with ferroelectric thin film with varying flow rate of Bi source material gas, namely, with varying Bi/Ti composition ratio. Referring to FIG. 3, the x-axis represents a diffraction angle 2 θ (deg); y-axis represents an X-ray diffraction intensity (a.u.); and the z-axis represents the Bi/Ti composition ratio. Here, "(00n)" (n being an integer) represents a diffraction peak due to the c-axis orientation of the $Bi_4Ti_3O_{12}$ (layered perovskite phase); and "(117)" represents a diffraction peak due to the (117) orientation containing a large amount of a-axis components of the $Bi_4Ti_3O_{12}$ (layered perovskite phase). The symbol "pyro (nnn)" represents a diffraction peak due to the $Bi_2Ti_2O_7$ (pyrochlore phase) having (111) orientation; and the symbol "pyro(n00)" represents a diffraction peak due to the $Bi_2Ti_2O_7$ (pyrochlore phase) having (100) orientation. The diffraction peak (Pt(100)) near 2 θ=40° (deg) is due to Pt of the lower electrode.

FIG. 3 shows that, if the Bi/Ti composition ratio is equal to or smaller than 0.9, a diffraction peak due to the pyro(222) or pyro(800) $Bi_2Ti_2O_7$ (pyrochlore phase) is observed, and it is understood that $Bi_4Ti_3O_{12}$ (layered perovskite phase) and $Bi_2Ti_2O_7$ (pyrochlore phase) are mingled. If the Bi/Ti composition ratio is equal to or more than 1.0, no diffraction peak due to the pyro(222) or pyro(800) $Bi_2Ti_2O_7$ (pyrochlore phase) is observed, and only the diffraction peak due to $Bi_4Ti_3O_{12}$ (layered perovskite phase) is observed, so that it is understood that the ferroelectric thin film consists of a $Bi_4Ti_3O_{12}$ single phase. Here, it has been confirmed that, if the Bi/Ti composition ratio is equal to or smaller than 0.5, the ferroelectric thin film consists only of $Bi_2Ti_2O_7$ (pyrochlore phase), though not shown in the Figure.

Figure 4:
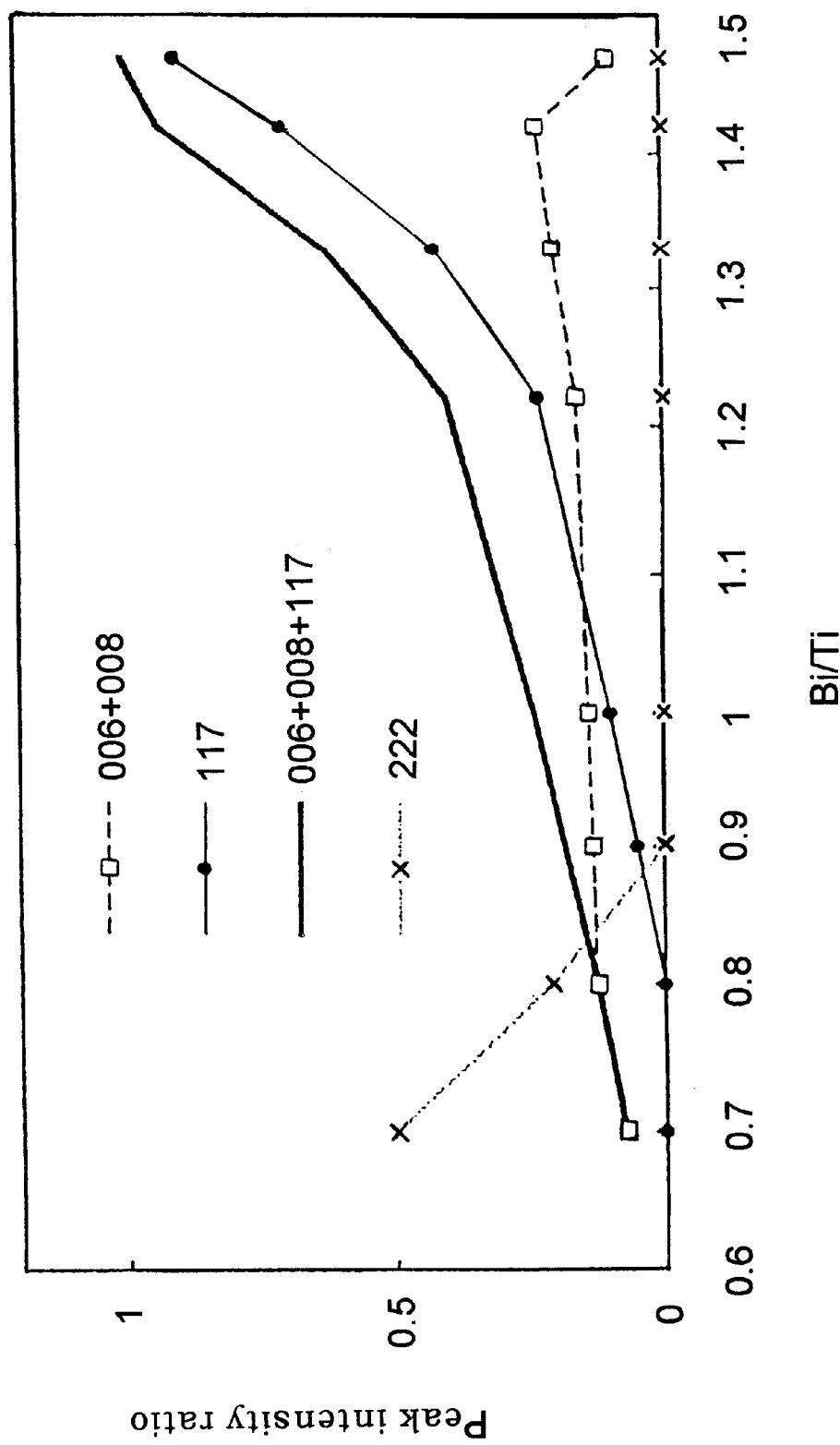
FIG. 4 is a view showing a relationship between the X-ray diffraction peak intensity ratio and the Bi/Ti composition ratio on the basis of the result of observation by X-ray diffraction of FIG. 3 in the ferroelectric $Bi_4Ti_3O_{12}$ thin film according to the first embodiment of the present invention.

From the result of X-ray diffraction pattern shown in FIG. 3, the reflection intensity (diffraction intensity) due to $Bi_4Ti_3O_{12}$ (layered perovskite phase) or $Bi_2Ti_2O_7$ (pyrochlore phase) was normalized on the basis of the sum of the reflection intensities of the diffraction peaks (006), (008) and (117) due to the $Bi_4Ti_3O_{12}$ (layered perovskite phase) obtained when the Bi/Ti composition ratio is 1.47. FIG. 4 shows the relationship between the X-ray diffraction peak intensity ratio and the Bi/Ti composition ratio obtained by plotting the peak intensity ratio on the axis of ordinate relative to the Bi/Ti composition ratio on the axis of abscissa. Referring to FIG. 4, "006+008" represents a sum of (006) reflection intensity and (008) intensity which are c-axis orientation components of $Bi_4Ti_3O_{12}$; "117" represents the (117) reflection intensity which is the (117) orientation component of $Bi_4Ti_3O_{12}$; "006+008+117" represents a sum of the (006), (008) and (117) reflection intensities of $Bi_4Ti_3O_{12}$; and "222" represents the (222) reflection intensity of the (111) orientation component of $Bi_2Ti_2O_7$.

FIG. 4 shows that, although the (006) and (008) reflection intensities which are the c-axis components of $Bi_4Ti_3O_{12}$ remain approximately constant irrespective of variation in the Bi/Ti composition ratio of the ferroelectric thin film, the (117) reflection intensity appears when the Bi/Ti composition ratio of the ferroelectric thin film is equal to or more than 0.9, and the (117) reflection intensity rapidly increases when the Bi/Ti composition ratio exceeds the stoichiometric ratio (Bi/Ti=4/3).

As shown above, the ferroelectric thin film has a c-axis orientation if the Bi/Ti composition ratio is equal to or less than 0.8, and the (117) orientation component increases according as the Bi/Ti composition ratio increases. Therefore, it is possible to control the c-axis orientation component and the (117) orientation component of $Bi_4Ti_3O_{12}$ in the ferroelectric thin film by varying the ratio of the Bi/Ti composition ratio in the ferroelectric thin film according to the present invention.

EXAMPLE 2

Figure 5:
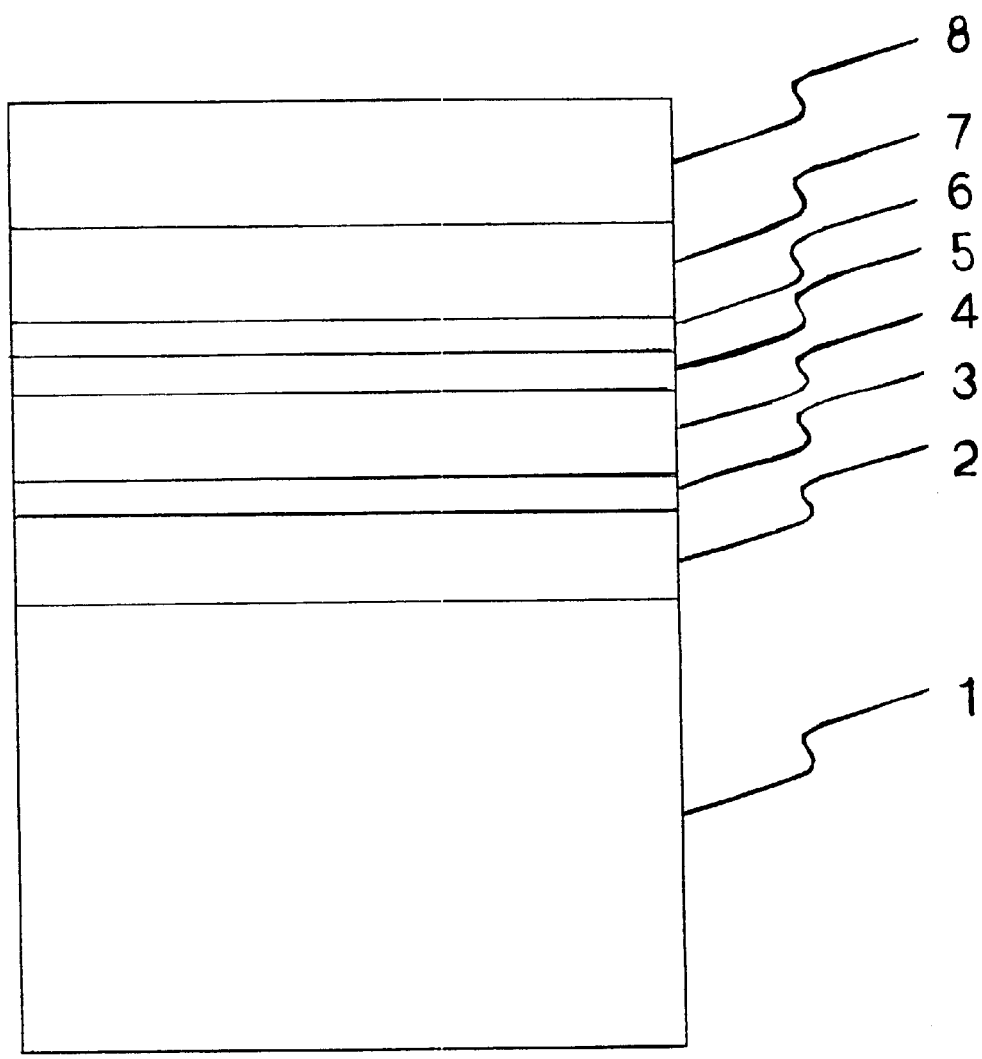
FIG. 5 is a schematic cross-sectional view showing a structure of the device having a capacitor structure according to the second embodiment of the present invention.

As the second embodiment of the present invention, a device having a capacitor structure shown in FIG. 5 was prepared by forming an upper electrode 8 on the ferroelectric thin film 7 of the substrate provided with the ferroelectric thin film according to the first embodiment. Namely, the device has a capacitor structure such that the ferroelectric thin film 7 is interposed between the lower electrode 4 and the upper electrode 8. The electric characteristics of the device were evaluated. The result of the evaluation will be hereinafter explained.

In manufacturing a device having a capacitor structure according to the second embodiment of the present invention, the steps up to the formation of the ferroelectric thin film 7 of the first embodiment are the same as those for manufacturing a substrate provided with a ferroelectric thin film in which the Bi/Ti composition ratio in the $Bi_4Ti_3O_{12}$ ferroelectric thin film is 1.0. Namely, the ferroelectric thin film 7 was manufactured by setting the Bi source gas flow rate (the Ar carrier gas ratio relative to the Bi source gas) to be 200 sccm at the time of forming the ferroelectric $Bi_4Ti_3O_{12}$ thin film. The capacitor structure was manufactured by forming a platinum (Pt) thin film with a diameter of 100 μmi and a thickness of 100 nm as the upper electrode 8 on the ferroelectric $Bi_4Ti_3O_{12}$ thin film by sputtering method.

Figure 6:
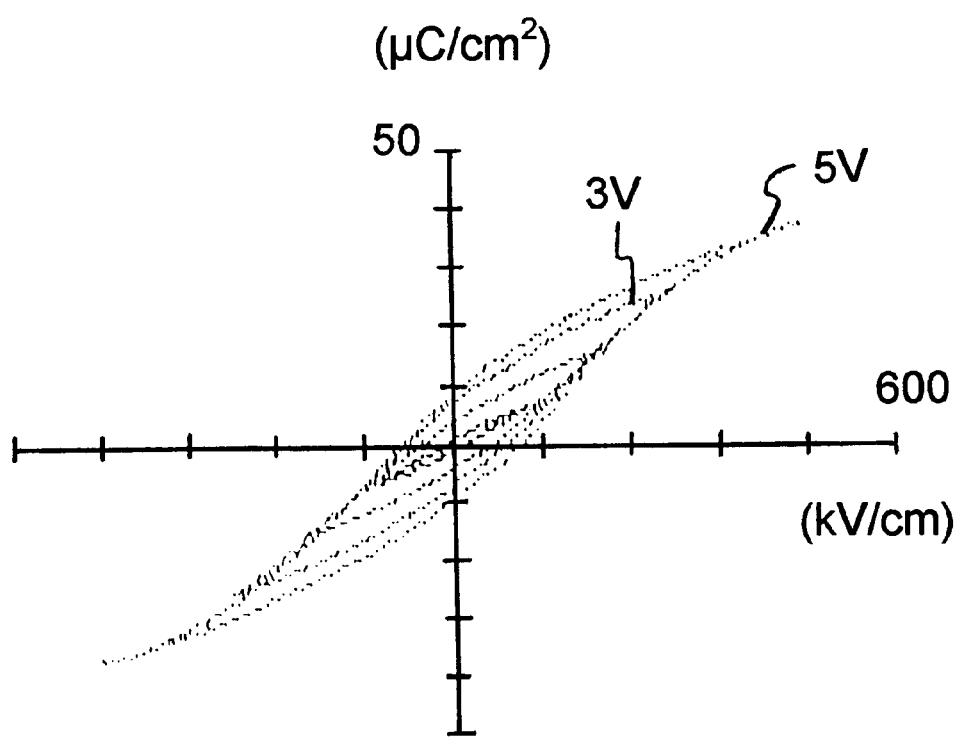
FIG. 6 is a view showing a ferroelectric hysteresis curve of the device having the capacitor structure according to the second embodiment of the present invention.

The ferroelectric characteristics of the device having the capacitor structure according to the second embodiment were measured. A clear hysteresis curve as shown in FIG. 6 was obtained as a result of the measurement. Namely, a hysteresis curve having a good shape was obtained with the remanent spontaneous polarization being Pr=5.6 μC/cm$^2$ and the coercive field being Ec=59 kV/cm when a voltage applied between the lower electrode 4 and the upper electrode 8 was 3V, and with the remanent spontaneous polarization being Pr=8.8 μC/cm$^2$ and the coercive field being Ec=66 kV/cm when a voltage applied between the lower electrode 4 and the upper electrode 8 was 5V. As shown in this hysteresis curve, a remanent spontaneous polarization which is larger than the remanent spontaneous polarization Pr=4 $\mu$C/cm$^2$ in the c-axis direction of a single crystal Bi$_4$Ti$_3$O$_{12}$ was obtained. This seems to be due to the following reason. The ferroelectric thin film having the Bi/Ti composition ratio of 1.0 has a (117) reflection although the c-axis components are strong compared with others, as previously described by referring to FIG. 3, so that the a-axis orientation component contained in a large quantity in the (117) orientation has a great influence on the remanent spontaneous polarization.

Figure 7:
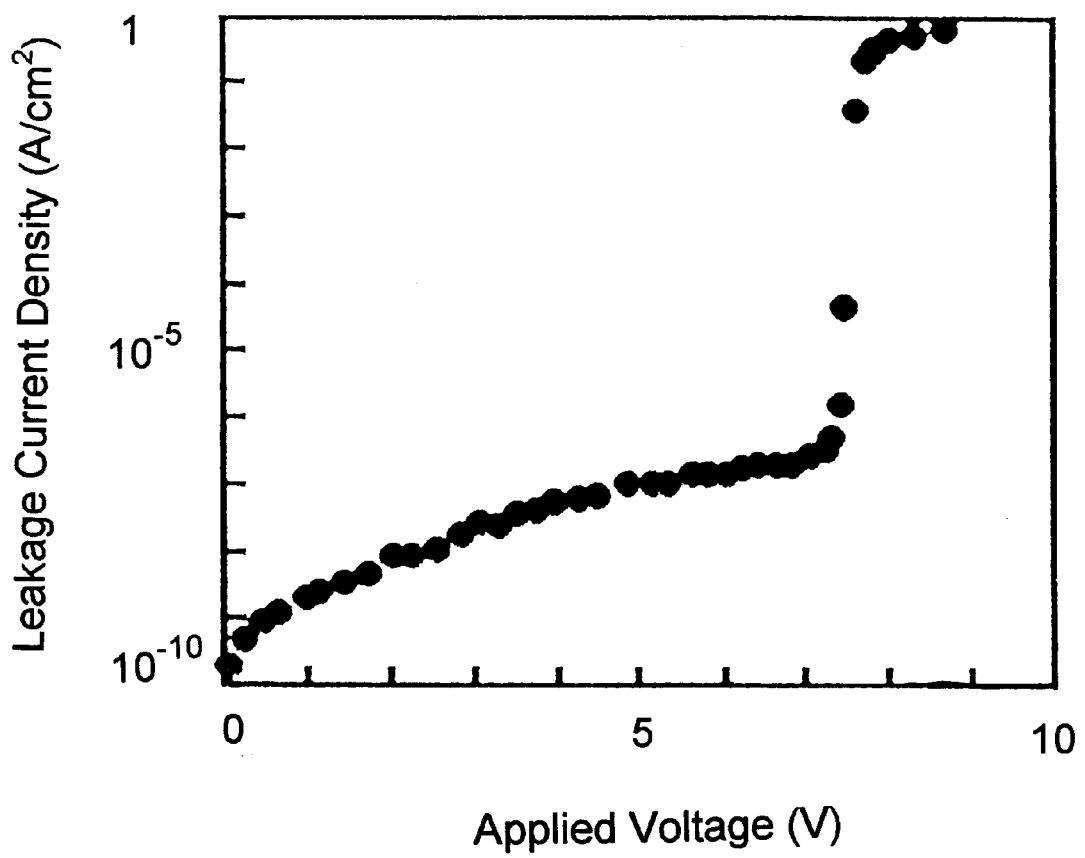
FIG. 7 is a view showing how the leakage current density depends on the applied voltage in the device having the capacitor structure according to the second embodiment of the present invention.

The leakage current characteristics (the dependency of the leakage current density on the applied voltage) of the device having a capacitor structure according to the second embodiment were measured. The result is shown in FIG. 7. It is understood from FIG. 7 that the second embodiment shows small and good leakage current characteristics. For example, a leakage current density of 4×10$^{-8}$ A/cm$^2$ was obtained when the voltage applied between the upper electrode 4 and the lower electrode 8 was 3 V, and a leakage current density of 1×10$^{-7}$ A/cm$^2$ was obtained when the voltage applied between the upper electrode 4 and the lower electrode 8 was 5 V.

EXAMPLE 3

As the third embodiment of the present invention, a device having a capacitor structure was manufactured with a structure similar to the one prepared according to the second embodiment as shown in FIG. 5 and with the Bi/Ti composition ratio being 1.47 in the ferroelectric Bi$_4$Ti$_3$O$_{12}$ thin film which is the ferroelectric thin film 7. The electric characteristics of the device were evaluated. The result of the evaluation will be explained below.

In manufacturing a device having a capacitor structure according to the third embodiment of the present invention, the steps up to the formation of the ferroelectric thin film 7 of the first embodiment are the same as those for manufacturing a substrate provided with a ferroelectric thin film in which the Bi/Ti composition ratio in the Bi$_4$Ti$_3$O$_{12}$ ferroelectric thin film is 1.47. Namely, the ferroelectric thin film 7 was manufactured by setting the Bi source gas flow rate (the Ar carrier gas ratio relative to the Bi source gas) to be 300 sccm at the time of forming the ferroelectric Bi$_4$Ti$_3$O$_{12}$ thin film. The capacitor structure was manufactured by forming a platinum (Pt) thin film as the upper electrode 8 on the ferroelectric Bi$_4$Ti$_3$O$_{12}$ thin film by sputtering method in the same manner as in the second embodiment.

Figure 8:
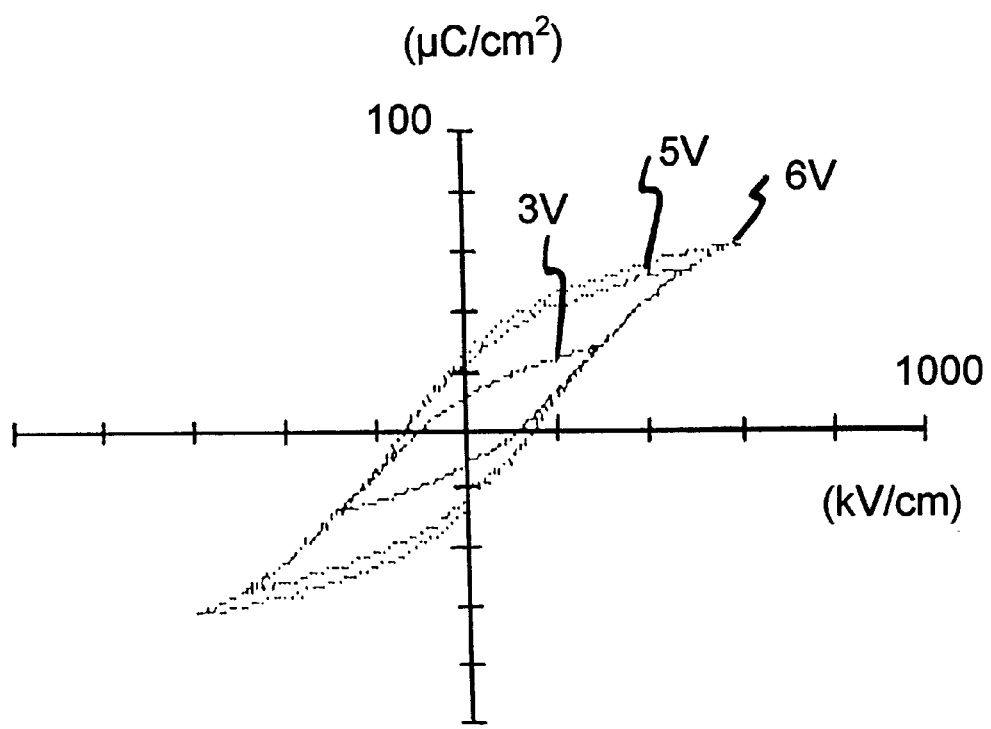
FIG. 8 is a view showing a ferroelectric hysteresis curve of the device having the capacitor structure according to the third embodiment of the present invention.

The ferroelectric characteristics of the device having the capacitor structure according to the third embodiment were measured. A clear hysteresis curve as shown in FIG. 8 was obtained as a result of the measurement. Namely, a hysteresis curve having a good shape and an extremely large remanent spontaneous polarization was obtained, with the remanent spontaneous polarization being Pr=12.0 $\mu$C/cm$^2$ and the coercive field being Ec=104 kV/cm when a voltage applied between the lower electrode 4 and the upper electrode 8 was 3V; with the remanent spontaneous polarization being Pr=23.6 $\mu$C/cm$^2$ and the coercive field being Ec=136 kV/cm when a voltage applied between the lower electrode 4 and the upper electrode 8 was 5V; and with the remanent spontaneous polarization being Pr=25.0 $\mu$C/cm$^2$ and the coercive field being Ec=138 kV/cm when a voltage applied between the lower electrode 4 and the upper electrode 8 was 6V. It seems that a large remanent spontaneous polarization such as this was obtained in the hysteresis curve because of the following reason. The ferroelectric thin film having the Bi/Ti composition ratio of 1.47 has the strongest (117) reflection when compared with others, as previously described by referring to FIG. 3, so that the ferroelectric thin film has the strongest (117) orientation and the a-axis orientation component contained in a large quantity in this (117) orientation has a great influence on the remanent spontaneous polarization.

Figure 9:
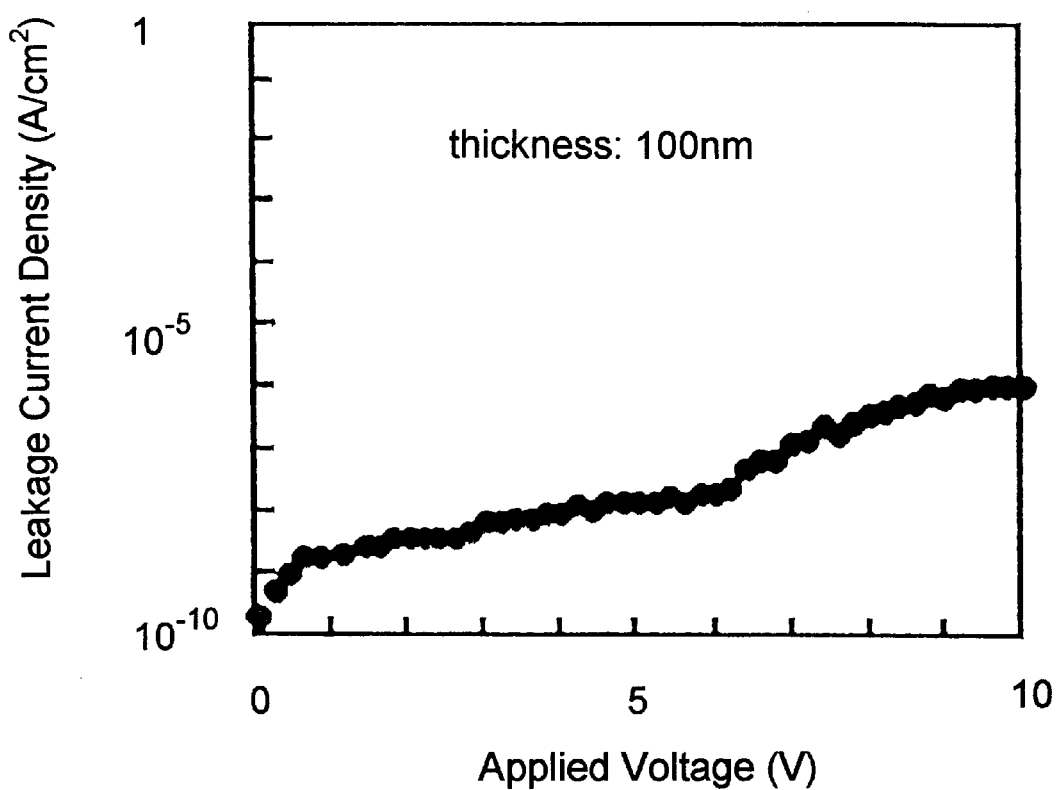
FIG. 9 is a view showing how the leakage current density depends on the applied voltage in the device having the capacitor structure according to the third embodiment of the present invention.

The leakage current characteristics (the dependency of the leakage current density on the applied voltage) of the device having a capacitor structure according to the third embodiment were measured. The result is shown in FIG. 9. It is understood from FIG. 9 that the third embodiment shows small and good leakage current characteristics. For example, a leakage current density of 8×10$^{-9}$ A/cm$^2$ was obtained when the voltage applied between the upper electrode 4 and the lower electrode 8 was 3 V, and a leakage current density of 2×10$^{-8}$ A/cm$^2$ was obtained when the voltage applied between the upper electrode 4 and the lower electrode 8 was 5 V. These leakage current densities are smaller than those in the second embodiment approximately by an order of magnitude. One of the reasons that the third embodiment showed improvement in leakage current characteristics compared with the second embodiment seems to be that the ferroelectric thin film in the third embodiment has a superior crystallinity.

Thus, an extremely large remanent spontaneous polarization was obtained according to the third embodiment of the present invention. This shows that the a-axis orientation component of Bi$_4$Ti$_3$O$_{12}$ can be utilized to a great extent and that an extremely large remanent spontaneous polarization can be obtained in a ferroelectric thin film having a strong (117) orientation component. Therefore, as described in the first embodiment, a large remanent spontaneous polarization can be obtained in a ferroelectric thin film in which the (117) orientation component is strong. A large remanent spontaneous polarization can be obtained if the Bi/Ti composition ratio in the ferroelectric Bi$_4$Ti$_3$O$_{12}$ thin film is within the range from ⅓ to 1.5, i.e. shifted from the stoichiometric composition so that Bi is supplied in an excess amount.

EXAMPLE 4

The above evaluation result of the electric characteristics of the second and third embodiments shows that small and good leakage current characteristics and excellent ferroelectric properties can be obtained even if the total thickness of the titanium oxide buffer layer, the Bi$_4$Ti$_3$O$_{12}$ crystal nucleus layer and the ferroelectric Bi$_4$Ti$_3$O$_{12}$ thin film is as small as 100 nm. Accordingly, as the fourth embodiment, surface morphology of these ferroelectric thin films were examined. The result will be explained below.

In the fourth embodiment of the present invention, film surface morphology of two kinds of substrates coated with a ferroelectric thin film was observed. One was a substrate manufactured according to the second embodiment without the upper electrode 8, namely, a substrate provided with a ferroelectric thin film according to the first embodiment prepared by setting the Bi source gas flow rate (the Ar carrier gas ratio relative to the Bi source gas) to be 200 sccm at the time of forming the ferroelectric Bi$_4$Ti$_3$O$_{12}$ thin film and with the Bi/Ti composition ratio in the ferroelectric Bi$_4$Ti$_3$O$_{12}$ thin film being 1.0. The other was a substrate manufactured according to the third embodiment without the upper electrode 8, namely, a substrate provided with a ferroelectric thin film according to the first embodiment prepared by setting the Bi source gas flow rate (the Ar carrier gas flow rate relative to the Bi source gas) to be 300 sccm at the time of forming the ferroelectric $Bi_4Ti_3O_{12}$ thin film and with the Bi/Ti composition ratio in the ferroelectric $Bi_4Ti_3O_{12}$ thin film being 1.47.

Figure 10:
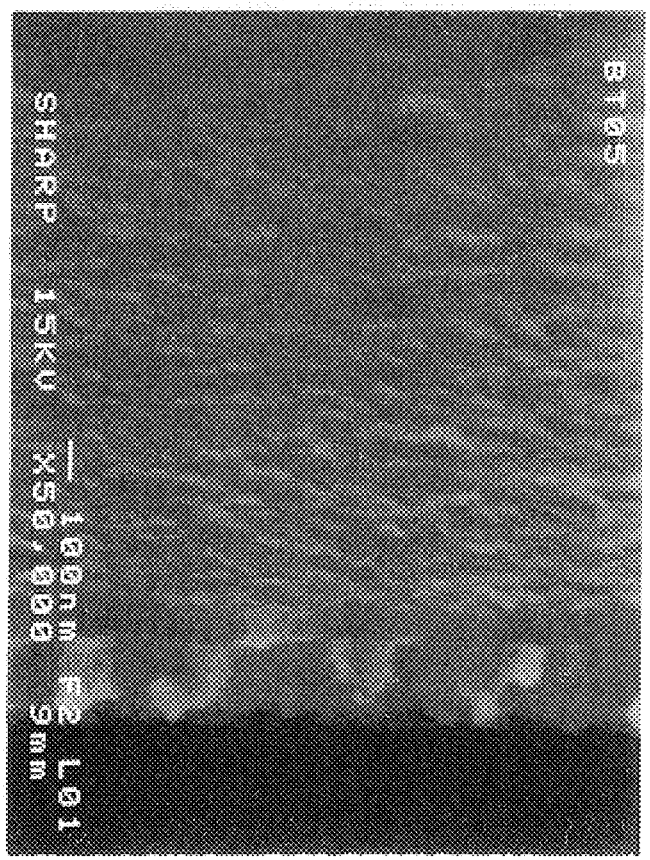
FIG. 10 is a microscopic view showing a result of observation by SEM of the substrate provided with the ferroelectric thin film (with the Bi/Ti composition ratio being 1.0 in the ferroelectric $Bi_4Ti_3O_{12}$ thin film) according to the fourth embodiment of the present invention.
Figure 11:
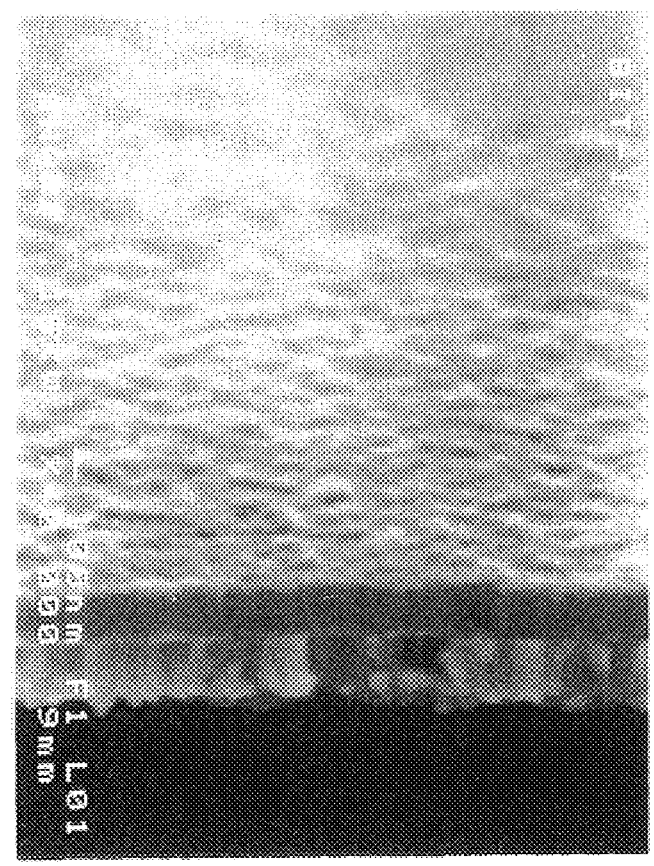
FIG. 11 is a microscopic view showing a result of observation by SEM of the substrate provided with the ferroelectric thin film (with the Bi/Ti composition ratio being 1.47 in the ferroelectric $Bi_4Ti_3O_{12}$ thin film) according to the fourth embodiment of the present invention.

Surface morphology of the substrates coated with a ferroelectric thin film, one with the Bi/Ti composition ratio of 1.0 and the other with the Bi/Ti composition ratio of 1.47, was observed by SEM from a direction in which the surface of the ferroelectric thin film and the cross-section of the substrate provided with the ferroelectric thin film can be observed. The result is shown in FIG. 10 (Bi/Ti=1.0) and in FIG. 11 (Bi/Ti=1.47). Although the scale is not shown in FIG. 11, it has a magnification ratio identical to the scale shown in FIG. 10. FIGS. 10 and 11 show that both of the ferroelectric films contain densely packed minute particles having a particle diameter of 10 nm order, so that their surfaces are extremely flat. It seems that, partly because an excellent thin film was formed as shown above in the embodiments of the present invention, the ferroelectric thin films according to the second and third embodiments had no pinholes generated, showed excellent small leakage current characteristics and exhibited extremely excellent ferroelectric properties even if the total thickness of the titanium oxide buffer layer, the crystal nucleus layer and the ferroelectric thin film was as small as 100 nm.

In application to devices, the ferroelectric thin film having such an excellent density and flatness is suitable for making the thickness of the film smaller and for minute processing of the devices, thereby greatly enlarging the application field of various highly integrated devices.

COMPARATIVE EXAMPLE 1

As a comparison example, a $Bi_4Ti_3O_{12}$ thin film having a thickness of 100 nm was formed on a Pt/Ta/SiO$_2$/Si substrate similar to the one in the first embodiment by MOCVD in the same manner as in the first embodiment except that the film was formed at a temperature (substrate temperature) of 600° C. with the Bi source gas flow rate (the Ar carrier gas flow rate relative to the Bi source gas) being 230 sccm and with the Ti source gas flow rate (the Ar carrier gas flow rate relative to the Ti source gas) being 50 sccm. The comparison example will be explained as below.

Figure 12:
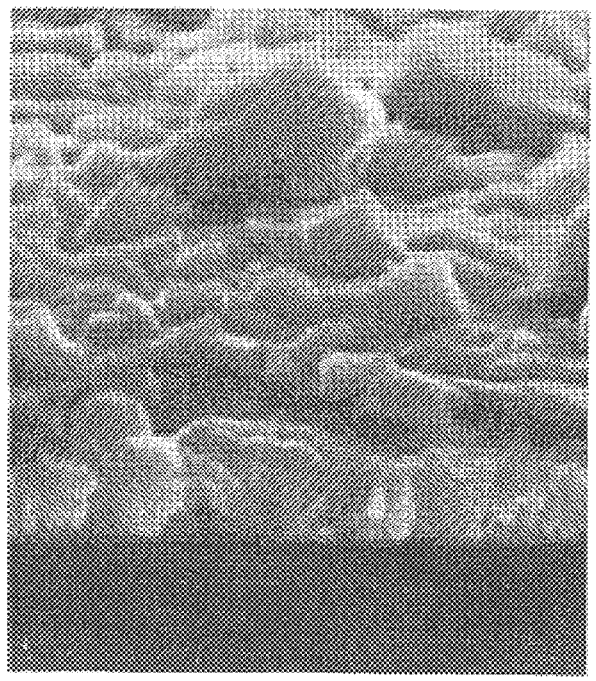
FIG. 12 is a microscopic view showing a result of observation by SEM of the $Bi_4Ti_3O_{12}$ thin film of the Comparison Example.
Figure 13:
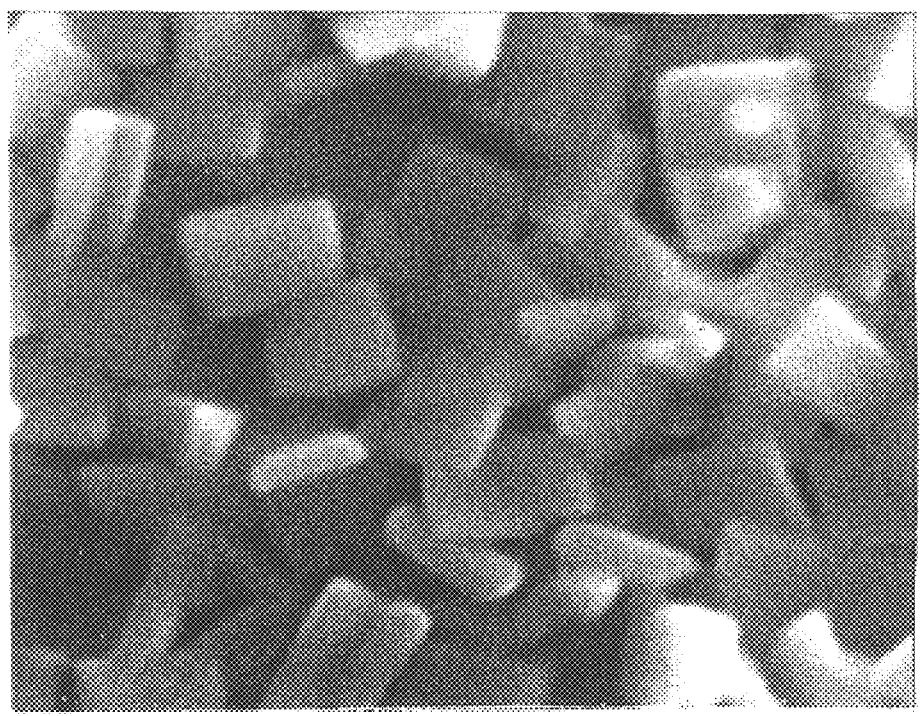
FIG. 13 is a microscopic view showing a result of observation by SEM of a surface of the $Bi_4Ti_3O_{12}$ thin film of the Comparison Example.

FIG. 12 shows surface morphology of the $Bi_4Ti_3O_{12}$ thin film of the comparison example observed in an oblique direction by SEM in the same manner as in the fourth embodiment. FIG. 13 shows the $Bi_4Ti_3O_{12}$ thin film observed approximately in a vertical direction. These Figures show that the $Bi_4Ti_3O_{12}$ thin film of the comparison example consists of huge plate-like crystals having a particle diameter of 200 to 500 nm and has a surface morphology which is extremely irregular (uneven). It is presumed that, in case of such a thin film as in the comparison example, a small thickness of about 100 nm causes generation of pinholes and greatly deteriorates the leakage current characteristics.

Comparison of the surface morphology of the above fourth embodiment with the surface morphology of the comparison example clearly shows that the thin film according to the fourth embodiment of the present invention is extremely excellent in density and flatness.

Figure 14:
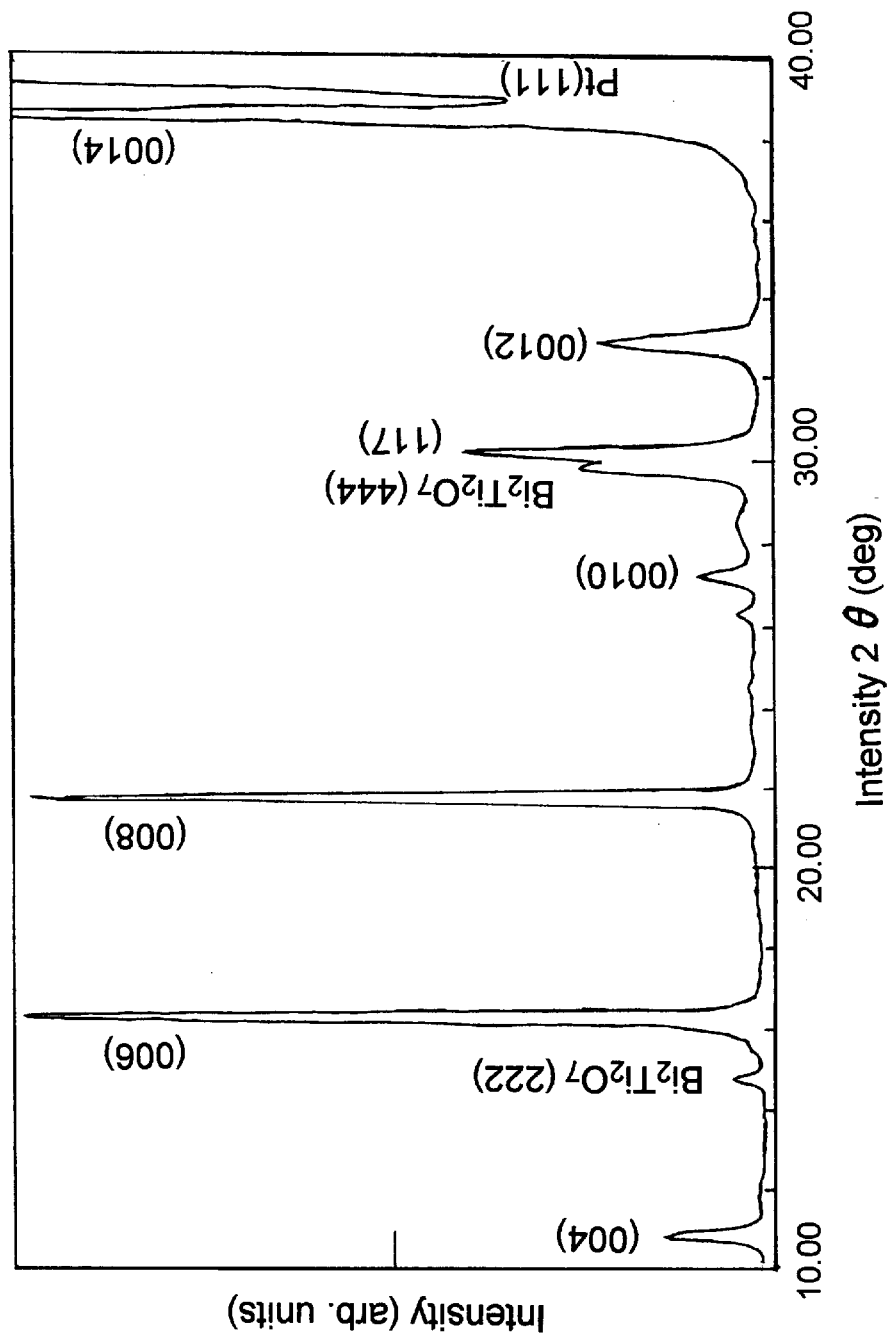
FIG. 14 is a view showing a result of observation by X-ray diffraction of the $Bi_4Ti_3O_{12}$ thin film of the Comparison Example.

FIG. 14 shows an X-ray diffraction pattern observed on the $Bi_4Ti_3O_{12}$ thin film of the comparison example. From FIG. 14, it is understood that, although (117) reflection of $Bi_4Ti_3O_{12}$ (layered perovskite phase) is observed, strong reflection peaks appear at (006) and (008) which are the c-axis orientation components of the $Bi_4Ti_3O_{12}$ (layered perovskite phase), so that the film has a strong c-axis orientation. Also, it is understood that comparatively large reflection peaks appear at $Bi_2Ti_2O_7$ (222) and (444) which are the (111) orientation components of the $Bi_2Ti_2O_7$ (pyrochlore phase), so that the film contains a large amount of pyrochlore phase.

Subsequently, an upper electrode was formed on the $Bi_4Ti_3O_{12}$ thin film of the comparison example in the same manner as in the above second and third embodiments. The electric properties thereof was measured, the result of which will be explained below.

A trial was made for measuring the ferroelectric properties of the $Bi_4Ti_3O_{12}$ thin film of the comparison example. However, no hysteresis characteristics were confirmed. Measurement of the leakage current characteristics showed that, when the applied voltage was 3 to 5 V, the leakage current density was $10^{-3}$ to $10^{-4}$ A/cm$^2$, which is larger than those in the above second and third embodiments by four to five orders of magnitude. This result corresponds to the observation of the surface morphology, and it is clear that the film of the present invention has more excellent electric properties. Moreover, in the comparison example, it seems that the thickness of the $Bi_4Ti_3O_{12}$ thin film must be further enlarged in order for the film to show ferroelectric properties. This shows that the thin film according to the present invention exhibits excellent ferroelectric properties even if the film thickness is as small as 100 nm.

Comparison between the above embodiments and the comparison example shows that, since the ferroelectric thin film could be formed at an extremely low temperature of 400° C. due to the presence of a titanium oxide buffer layer and a crystal nucleus layer, the obtained ferroelectric thin film exhibited excellent density, flatness and crystallinity.

EXAMPLE 5

As the fifth embodiment, devices having a capacitor structure were prepared by forming an upper electrode 8 (See FIG. 5) in the same manner as in the second and third embodiments on the ferroelectric thin film 7 (See FIG. 1) of each of the substrates coated with ferroelectric thin film with varying Bi/Ti composition ratio in the same manner as in the first embodiment. Electric properties of the devices were measured, the result of which will be explained below.

First, preparation of the substrates coated with ferroelectric thin film will be explained. In the first embodiment, nine kinds of substrates coated with ferroelectric thin film were prepared by varying the Bi source gas flow rate (the Ar carrier gas flow rate relative to the Bi source gas) as shown in the aforementioned Table 2 at the time of forming the $Bi_4Ti_3O_{12}$ crystal nucleus layer and the ferroelectric $Bi_4Ti_3O_{12}$ thin film. However, in the fifth embodiment, nine kinds of substrates coated with ferroelectric thin film were prepared by varying the Bi source gas flow rate as shown in Table 3, with the Bi/Ti composition ratios in the ferroelectric $Bi_4Ti_3O_{12}$ thin film being 0.7, 0.8, 0.9, 1.0, 1.1, 1.22, ⁴⁄₃, 1.42 and 1.47.

TABLE 3

| Bi source gas flow rate (sccm) | 170 | 180 | 190 | 200 | 210 | 220 | 230 | 250 | 300 |

TABLE 3-continued

| Bi/Ti composition ratio | 0.7 | 0.8 | 0.9 | 1.0 | 1.1 | 1.22 | 4/3 | 1.42 | 1.47 |
|---|---|---|---|---|---|---|---|---|---|

In the fifth embodiment, the substrates coated with a ferroelectric thin film were prepared in the same manner as in the first embodiment except for the condition of Bi source gas flow rate.

Further, nine kinds of devices having a capacitor structure were prepared by forming an upper electrode 8 (See FIG. 5) on the ferroelectric $Bi_4Ti_3O_{12}$ thin film of each of the nine kinds of substrates coated with ferroelectric thin film in the same manner as in the second and third embodiments.

Figure 15:
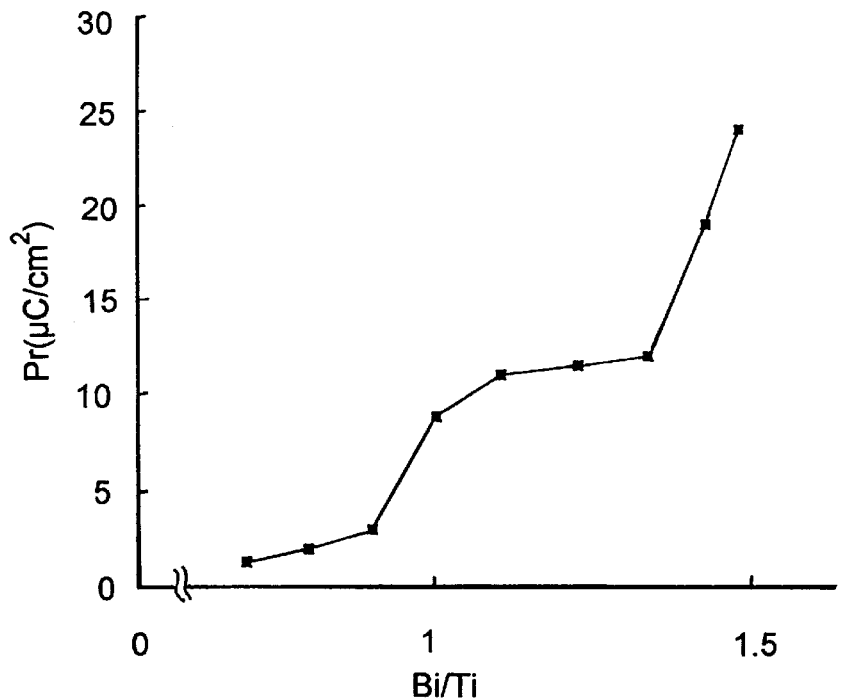
FIG. 15 is a view showing how the remanent spontaneous polarization Pr depends on the Bi/Ti composition ratio in the device having a capacitor structure according to the fifth embodiment of the present invention.

Electric properties of the devices having a capacitor structure prepared as above according to the fifth embodiment were measured, the result of which will be explained below. FIG. 15 shows the result of measurement on how the remanent spontaneous polarization Pr at the applied voltage of 5V depends on the Bi/Ti composition ratio (Bi/Ti) of the ferroelectric $Bi_4Ti_3O_{12}$ thin film. FIG. 15 includes the data of the second and third embodiments. FIG. 15 shows that, as the Bi/Ti composition ratio increases, the remanent spontaneous polarization Pr gradually rises when the Bi/Ti composition ratio is within the range from 0.7 to 1.0, and sharply rises when the Bi/Ti composition ratio is within the range from 1.0 to 1.1, and gradually rises again when the Bi/Ti composition ratio is within the range from 1.0 to the stoichiometric ratio (Bi/Ti=4/3). When the Bi/Ti composition ratio lies within the range from the stoichiometric ratio to 1.47, the remanent spontaneous polarization Pr sharply rises again as the Bi/Ti composition ratio increases. This shows that, for obtaining a ferroelectric thin film having a large remanent spontaneous polarization, the Bi/Ti composition ratio thereof may be larger than 4/3.

In view of the observation (See FIG. 3) of the X-ray diffraction pattern according to the first embodiment, this dependence of the remanent spontaneous polarization on the Bi/Ti composition ratio clearly shows that a large remanent spontaneous polarization can be obtained when the Bi/Ti composition ratio is within the range in which the (117) orientation component, namely the a-axis component, of $Bi_4Ti_3O_{12}$ can be utilized.

Figure 16:
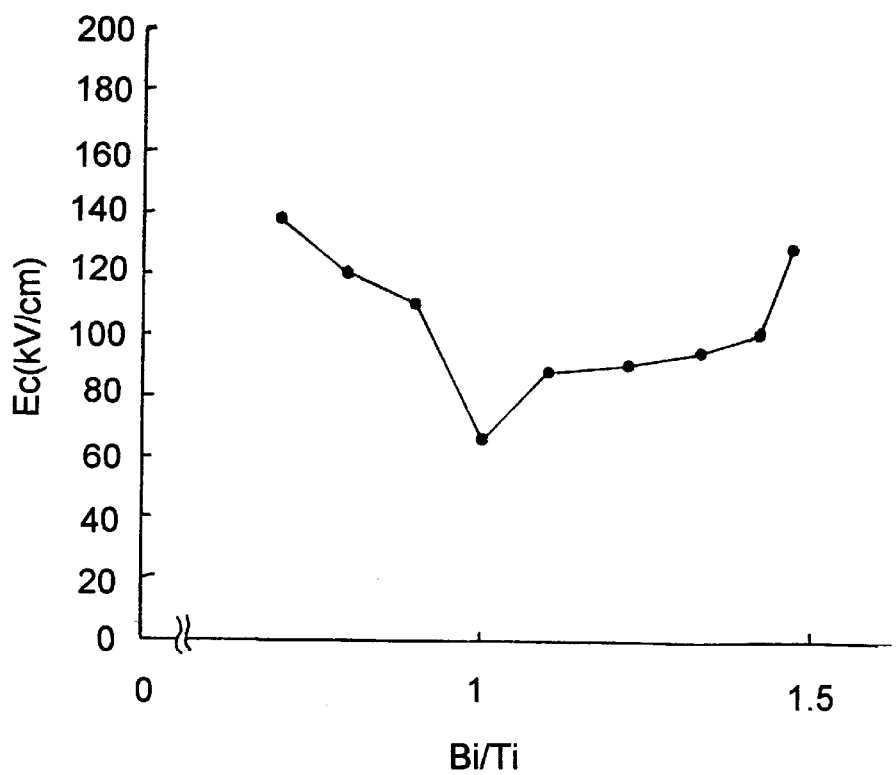
FIG. 16 is a view showing how the coercive field Ec depends on the Bi/Ti composition ratio in the device having a capacitor structure according to the fifth embodiment of the present invention.

FIG. 16 shows the result of measurement on how the coercive field Ec at the applied voltage of 5V depends on the Bi/Ti composition ratio (Bi/Ti) of the ferroelectric $Bi_4Ti_3O_{12}$ thin film. FIG. 16 includes the data of the second and third embodiments. FIG. 16 shows that, as the Bi/Ti composition ratio increases, the coercive field Ec decreases when the Bi/Ti composition ratio is within the range from 0.7 to 1.0, and increases when the Bi/Ti composition ratio is within the range from 1.0 to 1.47. This shows that, for obtaining a ferroelectric thin film having a small coercive field, the Bi/Ti composition ratio thereof may be set to be near 1.0.

As shown above, the present invention can realize a ferroelectric thin film having extremely excellent ferroelectric properties and being excellent in density and flatness even if the thickness of the film is less than 200 μm. Therefore, the present invention can greatly improve the leakage current characteristics, is suitable for various microminiaturization processes, and is effective in application to highly integrated devices.

Also, according to the present invention, it is possible to adjust the properties (the remanent spontaneous polarization and the coercive field) of the ferroelectric thin film to suit to a desired application device by shifting the Bi/Ti composition ratio in the ferroelectric thin film from the stoichiometric ratio, thereby realizing a large freedom in designing the ferroelectric thin film in accordance with the properties that are required in electronic devices to which the ferroelectric thin film is applied. When the composition ratio of Bi/Ti in the ferroelectric thin film is within the range from 0.7 to 1.5, the c-axis component and the a-axis component of the orientation of bismuth titanate ferroelectric thin film can be controlled.

Specifically, since the voltage applied to the commercially available capacitor-type FRAMs for memory operation is as high as 3 to 5V, a little larger coercive filed is permissible provided that the spontaneous polarization is large. Therefore, when the ferroelectric thin film of the present invention is applied to such an FRAM, it is possible to control the properties so as to have a large spontaneous polarization. Obtaining a large spontaneous polarization is also effective for reducing the errors in reading the data out. Moreover, even if the currently used devices are improved for low voltage driving, it is possible to realize a ferroelectric thin film having a large spontaneous polarization by reducing the thickness of the ferroelectric thin film of the present invention to half even if the coercive field is a little larger.

Especially, an extremely large remanent spontaneous polarization of 23.6 $\mu C/cm^2$ (applied voltage: 5V) was obtained in the bismuth titanate ferroelectric thin film having an extremely small thickness of 100 nm by setting the composition ratio of Bi/Ti in the ferroelectric thin film to be within the range from 4/3 to 1.5, i.e. shifted from the stoichiometric composition so that Bi is supplied in an excess amount.

Also, by shifting the Bi/Ti composition ratio to the Bi-rich side, it is possible to obtain an unexpected effect of reduced leak current density in addition to the increased spontaneous polarization due to increase in the a-axis orientation component.

According to a substrate provided with the above ferroelectric thin film, it is possible to improve the ferroelectric property of the ferroelectric film by disposing a buffer layer comprising titanium oxide, thereby realizing a ferroelectric thin film having the above excellent property. Further, when the a crystal nucleus layer is disposed between the buffer layer and the ferroelectric thin film, it is possible to improve the crystallinity of the ferroelectric thin film by providing a crystal nucleus layer, thereby realizing a ferroelectric thin film having the above excellent property.

Moreover, according to the device having a capacitor structure it is possible to realize a device having a capacitor structure excellent in various properties.

The method for manufacturing a ferroelectric thin film according to the present invention makes it possible to adjust the properties of the ferroelectric thin film to suit to a desired application device by shifting the Bi/Ti composition ratio in the ferroelectric thin film from the stoichiometric ratio to control the orientation of the ferroelectric thin film. In other words, the c-axis component and the (117) component of the orientation are controlled by setting the composition ratio of Bi/Ti to be within the range from 0.7 to 1.5 in the bismuth titanate ferroelectric thin film. Since the (117) component includes a large amount of a-axis component, the present invention makes it possible to control the remanent spontaneous polarization and the coercive field in the ferroelectric thin film by controlling the orientation, realizing a large freedom in designing the ferroelectric thin film in accordance with the properties that are required in electronic devices to which the ferroelectric thin film is applied.

Further, since the present invention employs MOCVD method instead of a conventional coating method such as MOD method or sol-gel method, a thin film of large area can be manufactured with good film thickness controllability and at high speed. This not only improves the productivity greatly but also makes it possible to control the properties of the ferroelectric thin film extremely easily by simply controlling the amount of the source gas to be supplied. Moreover, since the ferroelectric thin film can be formed in a low temperature process, the obtained ferroelectric thin film exhibits good ferroelectric properties and shows excellent density and flatness suitable for application to highly integrated devices.

What we claim is:

1. A ferroelectric thin film comprising minute particles having a particle diameter of about 10 nm which comprise a ferroelectric crystal having a single phase of layered crystal structure containing Bi, Ti and O as constituent elements, wherein the composition ratio of Bi/Ti in the ferroelectric thin film is within a range of 0.9 to 4/3.

2. The ferroelectric thin film according to claim 1, wherein the ferroelectric thin film has a thickness of 200 nm or less.

3. A substrate provided with a ferroelectric thin film, comprising:
    a semiconductor substrate;
    a buffer layer formed on the semiconductor substrate and comprising titanium oxide; and
    a ferroelectric thin film comprising minute particles having a particle diameter of about 10 nm which comprise a ferroelectric crystal having a single phase of layered crystal structure containing Bi, Ti and O as constituent elements, wherein the composition ratio of Bi/Ti in the ferroelectric thin film is within a range of 0.9 to 4/3.

4. The substrate provided with a ferroelectric thin film according to claim 3, wherein a crystal nucleus layer is disposed between the buffer layer and the ferroelectric thin film, the crystal nucleus layer serving as a growth nucleus of the ferroelectric crystal constituting the ferroelectric thin film.

5. A device having a capacitor structure comprising:
    at least one pair of electrodes and a ferroelectric thin film being interposed between the pair of electrodes, wherein the ferroelectric thin film comprises minute particles having a particle diameter of about 10 nm which comprise a ferroelectric crystal having a single phase of layered crystal structure containing Bi, Ti and O as constituent elements and the composition ratio of Bi/Ti in the ferroelectric thin film is within a range of 0.9 to 4/3.

6. A device having a capacitor structure, comprising a substrate provided with a ferroelectric thin film which comprises a semiconductor substrate, a buffer layer formed on the semiconductor substrate and a ferroelectric thin film comprising minute particles having a particle diameter of about 10 nm which comprise a ferroelectric crystal having a single phase of layered crystal structure containing Bi, Ti, and O as constituent elements, wherein the composition ratio of Bi/Ti in the ferroelectric thin film is within a range of 0.9 to 4/3, wherein the capacitor structure is such that a lower electrode is disposed between the substrate and the buffer layer and an upper electrode is disposed on the ferroelectric thin film.

7. A method for manufacturing a ferroelectric thin film comprising minute particles having a particle diameter of about 10 nm which comprise a ferroelectric crystal having a single phase of layered crystal structure containing Bi, Ti and O as constituent elements, wherein a c-axis component and a (117) component of the orientation of the ferroelectric crystal in the ferroelectric thin film is controlled by varying the composition ratio of Bi/Ti in the ferroelectric thin film within a range of 0.9 to 4/3.

8. The method for manufacturing a ferroelectric thin film according to claim 7, wherein the ferroelectric crystal comprises bismuth titanate.

9. The method for manufacturing a ferroelectric thin film according to claim 8, comprising forming the ferroelectric thin film on a substrate through supplying a Bi source gas and a Ti source gas by MOCVD method, wherein the composition ratio of Bi/Ti in the ferroelectric thin film is allowed to vary by controlling the amount of at least one of the Bi source gas and the Ti source gas to be supplied in forming the ferroelectric thin film.

10. The method for manufacturing a ferroelectric thin film according to claim 9, further comprising forming a buffer layer comprising titanium oxide on the substrate before forming the ferroelectric thin film.

11. The method for manufacturing a ferroelectric thin film according to claim 10, further comprising forming a crystal nucleus layer on the buffer layer by MOCVD method at a temperature of 450° C. to 650° C. before forming the ferroelectric thin film on the crystal nucleus layer, the crystal nucleus layer serving as a growth nucleus of the ferroelectric crystal constituting the ferroelectric thin film.

12. A ferroelectric thin film comprising minute particles having a particle diameter of about 10 nm which comprise a ferroelectric crystal having a single phase of layered crystal structure containing Bi, Ti and O as constituent elements, wherein the composition ratio of Bi/Ti in the ferroelectric thin film is in the range of 4/3 to 1.5.

13. The ferroelectric thin film according to claim 12, wherein a residual spontaneous polarization of the ferroelectric thin film is in the range of 3 to 25 uC/cm$^2$.

14. The substrate provided with a ferroelectric thin film according to claim 12, wherein a crystal nucleus layer is disposed between the buffer layer and the ferroelectric thin film, the crystal nucleus layer serving as a growth nucleus of the ferroelectric crystal constituting the ferroelectric thin film.

15. A substrate provided with a ferroelectric thin film, comprising:
    a semiconductor substrate;
    a buffer layer formed on the semiconductor substrate;
    a ferroelectric thin film comprising minute particles having a diameter of about 10 nm which comprise a ferroelectric crystal having a single phase of layered crystal structure containing Bi, Ti and O as constituent elements wherein the composition ratio of Bi/Ti in the ferroelectric thin film is within a range of 4/3 to 1.5.

16. A device having a capacitor structure comprising:
    at least one pair of electrodes and a ferroelectric thin film being interposed between the pair of electrodes, wherein the ferroelectric thin film comprises minute particles having a particle diameter of about 10 nm which comprise a ferroelectric crystal having a single phase containing Bi, Ti and O as constituent elements, wherein the composition ratio of Bi/Ti in the ferroelectric thin film is within the range of 4/3 to 1.5.

17. A device having a capacitor structure, comprising a substrate provided with a ferroelectric thin film which comprises a semiconductor substrate, a buffer layer formed on the semiconductor substrate and a ferroelectric thin film comprising minute particles having a particle diameter of about 120 nm which comprise a ferroelectric crystal having a single phase containing Bi, Ti and O as constituent elements, wherein the composition ratio of Bi/ Ti in the ferroelectric thin film is within the range of ⅔ to 1.5, wherein the capacitor structure is such that a lower electrode is disposed between the substrate and the buffer layer and an upper electrode is disposed on the ferroelectric thin film.

* * * * *